US007012672B2

(12) United States Patent
Van Rhee et al.

(10) Patent No.: US 7,012,672 B2
(45) Date of Patent: Mar. 14, 2006

(54) LITHOGRAPHIC APPARATUS, SYSTEM, METHOD, COMPUTER PROGRAM, AND APPARATUS FOR HEIGHT MAP ANALYSIS

(75) Inventors: Tasja Van Rhee, Rosmalen (NL); Thomas Josephus Maria Castenmiller, Eindhoven (NL); Willem Herman Gertruda Anna Koenen, Roermond (NL); Alex Van Zon, Eindhoven (NL); Michael Broers, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 146 days.

(21) Appl. No.: 10/796,309

(22) Filed: Mar. 10, 2004

(65) Prior Publication Data

US 2004/0239905 A1    Dec. 2, 2004

(30) Foreign Application Priority Data

Mar. 10, 2003    (EP) ................................. 03075698

(51) Int. Cl.
G03B 27/42    (2006.01)
G03B 27/52    (2006.01)
G01N 21/00    (2006.01)
G01B 11/24    (2006.01)

(52) U.S. Cl. .................. 355/53; 355/55; 356/237.4; 356/237.5; 356/601

(58) Field of Classification Search .................. 355/53, 355/55, 67, 68, 72, 77; 356/237.3, 237.4, 356/237.5, 601

See application file for complete search history.

(56) References Cited

U.S. PATENT DOCUMENTS

| 5,191,200 | A | 3/1993 | van der Werf et al. |
| 5,748,323 | A | 5/1998 | Levinson |
| 6,208,407 | B1 * | 3/2001 | Loopstra ...................... 355/53 |

FOREIGN PATENT DOCUMENTS

| EP | 1 037 117 A2 | 9/2000 |
| WO | WO 97/33205 | 9/1997 |
| WO | WO 98/28665 | 7/1998 |

OTHER PUBLICATIONS

European Search Report dated Aug. 14, 2003, in reference to EP 03 07 5698.

* cited by examiner

*Primary Examiner*—Alan Mathews
(74) *Attorney, Agent, or Firm*—Pillsbury Winthrop Shaw Pittman, LLP

(57) ABSTRACT

A lithographic projection apparatus and method of manufacturing devices using such an apparatus is presented. The apparatus includes a level sensor to measure the height of a wafer in a plurality of points. The height info is sent to a processor which is arranged to create a measured height map using input from the level sensor. In one embodiment of the invention, the processor is also arranged to calculate an average die topology using the measured height map in order to produce a raw height map of the surface of the substrate, and to detect any focus spots on said surface of said substrate using the raw height map. By subtracting the average die topology, focus spots can be located more accurately than before.

36 Claims, 4 Drawing Sheets

LITHOGRAPHIC APPARATUS, SYSTEM, METHOD, COMPUTER PROGRAM, AND APPARATUS FOR HEIGHT MAP ANALYSIS

RELATED APPLICATIONS

This application claims priority to European Patent Application No. EP 03075698.5, filed Mar. 10, 2003, which document is herein incorporated by reference.

FIELD OF THE INVENTION

The present invention relates to lithographic apparatus and methods.

BACKGROUND

A lithographic apparatus may include a radiation system for supplying a projection beam of radiation; a first object table provided with a mask holder for holding a mask; a second object table provided with a substrate holder for holding a substrate; and a projection system for imaging an irradiated portion of the mask onto a target portion of the substrate. For the sake of simplicity, the projection system may hereinafter be referred to as the "lens"; however, this term should be broadly interpreted as encompassing various types of projection system, including refractive optics, reflective optics, catadioptric systems, and charged particle optics, for example. The radiation system may also include elements operating according to any of these principles for directing, shaping or controlling the projection beam, and such elements may also be referred to below, collectively or singularly, as a "lens".

In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more tables while one or more other tables are being used for exposures.

Lithographic projection apparatus can be used, for example, in the manufacture of integrated circuits (ICs). In such a case, the mask (reticle) may contain a circuit pattern corresponding to an individual layer of the IC, and this pattern can be imaged onto a particular area (die) on a substrate (silicon wafer) which has been coated with a layer of photosensitive material (resist). In general, a single wafer will contain a whole network of adjacent dies, which are successively irradiated via the reticle, one at a time. Note that instead of irradiation of only one die, several dies at once may be exposed to the radiation. Such an area which is exposed at a certain moment in time is referred to as an 'exposure area'.

In one type of lithographic projection apparatus, each die is irradiated by exposing the entire reticle pattern onto the die at once; such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally<1), the speed V at which the wafer table is scanned will be a factor M times that at which the reticle table is scanned. More information with regard to lithographic devices as here described can be gleaned from International Patent Application WO 97/33205, for example.

In a manufacturing process using a lithographic projection apparatus according to the invention, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallisation, oxidation, chemo-mechanical polishing, etc., all intended to finish off an individual layer. If several layers are required, then it may be desirable or necessary to repeat the whole procedure, or a variant thereof, for each new layer. Eventually, an array of devices (dies) will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of an apparatus according to an embodiment of the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "exposure area", respectively.

In the present document, the terms "radiation" and "beam" are used to encompass all types of electromagnetic radiation or particle flux, including, but not limited to, ultraviolet radiation (e.g. at a wavelength of 365 nm, 248 nm, 193 nm, 157 nm or 126 nm), extreme ultraviolet radiation (EUV), X-rays, electrons and ions. Also herein, the invention is described using a reference system of orthogonal X, Y and Z directions. Further, unless the context otherwise requires, the term "vertical" (Z) used herein is intended to refer to the direction normal to the substrate or mask surface, rather than implying any particular orientation of the apparatus.

Until very recently, lithographic apparatus contained a single mask table and a single substrate table. However, machines are now becoming available in which there are at least two independently moveable substrate tables; see, for example, the multi-stage apparatus described in International Patent Applications WO 98/28665 and WO 98/40791. A basic operating principle behind at least some such multi-stage apparatus is that, while a first substrate table is at the exposure position underneath the projection system for exposure of a first substrate located on that table, a second substrate table can run to a loading position, discharge a previously exposed substrate, pick up a new substrate, perform some initial measurements on the new substrate and then stand ready to transfer the new substrate to the exposure position underneath the projection system as soon as exposure of the first substrate is completed; the cycle then repeats. In this manner it is possible to increase substantially the machine throughput, which in turn improves the cost of ownership of the machine. It should be understood that the same principle could be used with just one substrate table which is moved between exposure and measurement position.

The measurements performed on the substrate at the measurement position may, for example, include a determination of the spatial relationship (e.g. in X and Y directions) between various contemplated exposure areas on the substrate, one or more reference markers on the substrate, and at least one reference marker (e.g. fiducial) located on the substrate table outside the area of the substrate. Such information can subsequently be employed at the exposure position to perform a fast and accurate X and Y positioning of the exposure areas with respect to the projection beam.

The measurements performed also include generating a map of the topology of the substrate. The map comprises a plurality of substrate height measurements, each recorded with associated X and Y co-ordinates. The map is commonly referred to as a height map.

In European Published Patent Application No. EP 1037117, a lithographic projection apparatus is discussed that aims to position a wafer at the optimum position for a given exposure. However, the variations in wafer surface height over the exposure area may be such that the wafer cannot be positioned to give adequate focus over the entire exposure area. Abnormal topology differences on a wafer (i.e. substrate) are called 'focus spots'. These focus spots decrease the imaging capability of the specific exposures, which may even result in an exposure failure.

SUMMARY

A lithographic apparatus according to one embodiment of the invention includes a level sensor arranged to determine a height of each of a plurality of points on a surface of a substrate, the substrate being provided with at least one die; and a processor configured to create a first height map based on the determined heights, to calculate a topology based on information of the first height map that corresponds to the at least one die, and to produce a second height map of said surface based on a difference between the topology and the first height map.

In one embodiment the processor is arranged to smooth the raw height map using a moving average principle, thereby producing a smoothed height map; to subtract the smoothed height map from the raw height map, thereby producing a subtracted height map; to determine at least one deviation threshold F; and to determine focus spots as being areas in which a residual on the subtracted height map is greater than the at least one deviation threshold F.

The moving average may be calculated using a relatively large (i.e. compared to the expected size of the focus spots) smoothing window which determines slow variations in the surface height. The smoothed height map may be subtracted from the raw height map, and focus spots may be identified as locations in which a threshold value is exceeded.

In an embodiment, the at least one deviation threshold F is defined as n·σ, where n is a predetermined value and σ is a standard deviation of all residuals for every position x, y on the subtracted height map.

In yet another embodiment, the processor is arranged to remove height information from the subtracted height map of dies that overlap with the determined focus spots, thereby producing a feedback height map; to calculate a corrected average die topology using the feedback height map; to produce a corrected raw height map of the surface of the substrate (e.g. by subtracting the corrected average die topology from the feedback height map for dies on the substrate); to smooth the corrected raw height map (e.g. using a moving average principle), thereby producing a corrected smoothed height map; to subtract the corrected smoothed height map from the corrected raw height map, thereby producing a corrected subtracted height map; to determine the at least one deviation threshold F; to determine the focus spots as being areas in which a residual on the corrected subtracted height map is greater than the at least one deviation threshold F; and repeat such actions (e.g. calculate and apply further feedback height maps) until a certain accuracy level is reached.

In another embodiment, the apparatus comprises a reporting system, wherein the reporting system and the processor are arranged to report different classifications of focus spots.

Embodiments of the present invention also relate to a method of manufacturing devices using a lithographic projection apparatus comprising a radiation system for supplying a projection beam of radiation; a first object table provided with a mask holder for holding a mask; a second object table provided with a substrate holder for holding a substrate; and a projection system for imaging irradiated portions of the mask onto target portions of the substrate; a level sensor arranged to measure the height of a plurality of points on the surface of a substrate provided with at least one die, and a processor arranged to create a measured height map using input from the level sensor, the method comprising providing a mask bearing a pattern to the first object table; providing a substrate having a radiation-sensitive layer to the second object table; imaging the irradiated portions of the mask onto the target portions of the substrate; and generating, for the substrate, a measured height map indicating the height of a plurality of points on the substrate surface, characterized by calculating an average die topology using the measured height map; subtracting the average die topology from the measured height map for dies on the substrate, to produce a raw height map of the surface of the substrate in order to detect any focus spots on the surface of the substrate using the raw height map.

BRIEF DESCRIPTION OF THE DRAWINGS

Embodiments of the present invention will be described below with reference to exemplary embodiments and the accompanying schematic drawings, in which.

DETAILED DESCRIPTION

Figure 1:
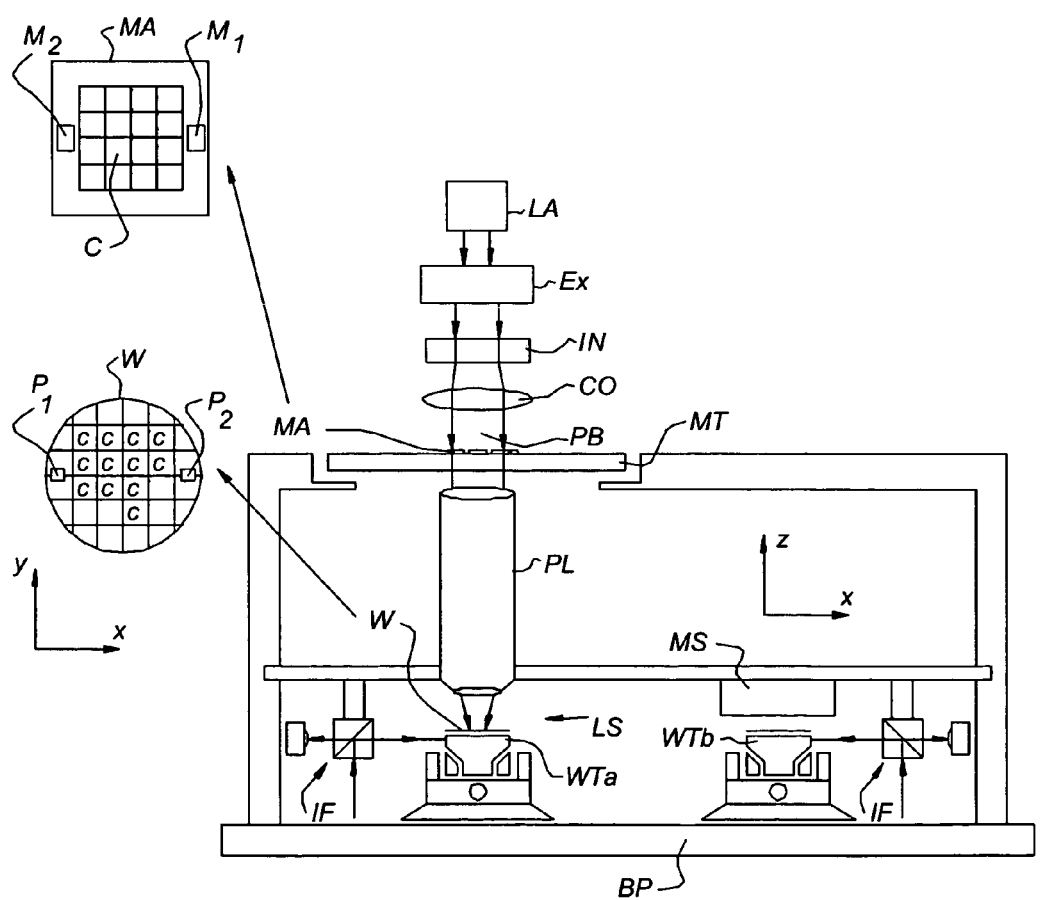
FIG. 1 depicts a lithographic projection apparatus according to an embodiment of the invention.

European Published Patent Application No. EP 1037117 describes a multi-stage apparatus wherein exposure failures can be predicted in advance and remedial action can be taken. For example, the wafer may be stripped and recoated without the detrimental effect of further processing a badly exposed wafer. Alternatively, if the predicted failure affects only one or a few devices on the wafer whilst others will be acceptable, throughput may be enhanced by skipping exposures that are predicted in advance to result in defective devices.

Focus-spot detection can be derived from analysis of height maps taken. The presence in a wafer height map of relatively large deviations from a global wafer plane could indicate focus spots which may be due to substrate unflatness or process influences. Comparing wafer height maps from several wafers can indicate focus spots due to contamination or unflatness of the substrate table. When focus spots appear at identical or near-identical positions for different wafers, this is most likely caused by substrate holder contamination (so-called "chuck-spots"). Focus spots occurring on a single wafer may also be identified. Projections of the wafer surface above an average die surface are identified as suspected focus spots.

At least some embodiments of the present invention may be used to improve focus spot monitoring in a lithographic projection apparatus. Such an apparatus may include a processor arranged to calculate an average die topology using a measured height map, and to subtract the average die topology from the measured height map for dies on the substrate, to produce a raw height map of the surface of the substrate in order to detect any focus spots on the surface of the substrate using the raw height map. Subtracting an average die topology results in a height map of the substrate 'underneath' the dies, which possesses more accurate information on focus spots, than the top surface of the wafer.

The team 'height map' is intended to include a plurality of height measurements (e.g. of a surface of a substrate), each measurement being associated (e.g. in a recording) with at least one corresponding spatial location (e.g. X and Y coordinates in a plane, which plane may be assumed or also expressed).

In at least some embodiments, a second object table is movable between an exposure station, at which the projection system can image the mask portion onto the substrate, and a measurement station, and the apparatus comprises a positioning system for moving the second object table between the exposure station and the measurement station, and a control unit constructed and arranged to control the position of the second object table in at least the first direction, during exposure of the target portion, in accordance with the measured height map. The multi-stage apparatus allows calculation of the focus spots before or during exposure and hence shortens the response time to a possible focus spot. The level sensor in a multi-stage apparatus may use much smaller spots, i.e. higher sensor resolution, which may result in more detail of the height maps and more precise identification of focus spots.

By removing the height information of the dies that are on top of a focus spot, and repeating the processing steps mentioned, obvious errors may be filtered out. Such errors may include, for example, measurement errors, also known as 'flyers', local dirt on the substrate, or a focus spot itself. By filtering out the obvious errors (e.g. in a feedback operation), a higher degree of accuracy can be reached.

The inventors have realized that many dies have regular structures (e.g. DRAM), and that significantly improved focus spot detection may be achieved by taking account of these structures. In a method according to an embodiment of the invention, a height map of the entire wafer is made. Following mapping of the wafer, the regular structure of the die is determined by averaging the topologies of all the dies on the wafer to obtain an average die topology. Then the average die topology is subtracted from each die location of the measured height map, to leave a raw height map of the 'underlying' wafer.

Embodiments of the present invention relate to a lithographic apparatus including a level sensor arranged to measure the height of a plurality of points on the surface of a substrate provided with at least one die; and a processor arranged to create a measured height map using input from the level sensor.

FIG. 1 schematically depicts a lithographic projection apparatus according to an embodiment of the invention. The apparatus comprises:

- a radiation system LA, Ex, IN, CO for supplying a projection beam PB of radiation (e.g. UV or EUV radiation);
- a first object table (mask table) MT provided with a mask holder for holding a mask MA (e.g. a reticle), and connected to a first positioning structure (e.g. including one or more linear or planar motors) for accurately positioning the mask with respect to item PL;
- a second object table (substrate or wafer table) WTa provided with a substrate holder for holding a substrate W (e.g. a resist-coated silicon wafer), and connected to a second positioning structure for accurately positioning the substrate with respect to item PL;
- a third object table (substrate or wafer table) WTb provided with a substrate holder for holding a substrate W (e.g. a resist-coated silicon wafer), and connected to third positioning structure for accurately positioning the substrate with respect to item PL;
- a measurement system MS for performing measurement (characterization) processes on a substrate held on a substrate table WTa or WTb at a measurement station;
- a projection system ("lens") PL (e.g. a refractive or catadioptric system, a mirror group or an array of field deflectors) for imaging an irradiated portion of the mask MA onto an exposure area C (die) of a substrate W held in a substrate table WTa or WTb at an exposure station.

As here depicted, the apparatus is of a transmissive type (i.e. has a transmissive mask). However, in general, it may also be of a reflective type, for example.

The radiation system comprises a source LA (e.g. a Hg lamp, excimer laser, an undulator provided around the path of an electron beam in a storage ring or synchrotron, a laser plasma source or an electron or ion beam source) which produces a beam of radiation. This beam is passed along various optical components comprised in the illumination system (e.g. beam shaping optics Ex, an integrator IN and a condenser CO) so that the resultant beam PB has a desired shape and intensity distribution in its cross-section.

The beam PB subsequently intercepts the mask MA which is held in a mask holder on a mask table MT. Having passed through the mask MA, the beam PB passes through the lens PL, which focuses the beam PB onto an exposure area C of the substrate W. With the aid of the interferometric displacement and measuring assembly IF, the substrate tables WTa, WTb can be moved accurately by the second and third positioning means, e.g. so as to position different exposure areas C in the path of the beam PB. Similarly, the first positioning structure can be used to accurately position the mask MA with respect to the path of the beam PB, e.g. after mechanical retrieval of the mask MA from a mask library. In general, movement of the object tables MT, WTa, WTb will be realized with the aid of a long stroke module (course positioning) and a short stroke module (fine positioning), which are not explicitly depicted in FIG. 1. In the case of a wafer stepper (as opposed to a step-and-scan apparatus) the reticle table may be connected only to a short stroke positioning device, to make fine adjustments in mask orientation and position.

The second and third positioning structures may be constructed so as to be able to position their respective substrate tables WTa, WTb over a range encompassing both the exposure station under projection system PL and the measurement station under the measurement system MS. Alternatively, the second and third positioning structures may be replaced by separate exposure station and measurement station positioning systems for positioning a substrate table in the respective exposure stations and a table exchange assembly for exchanging the substrate tables between the two positioning systems. Suitable positioning systems are described, inter alia, in WO 98/28665 and WO 98/40791 mentioned above. It should be noted that a lithography apparatus may have multiple exposure stations and/or multiple measurement stations and that the numbers of measurement and exposure stations may be different than each other and the total number of stations need not equal the number of substrate tables. Indeed, the principle of separate exposure and measurement stations may be employed even with a single substrate table.

The depicted apparatus can be used in two different modes:

1. In step-and-repeat (step) mode, the mask table MT is kept essentially stationary, and an entire mask image is projected at once (i.e. in a single "flash") onto an exposure area C. The substrate table WT is then shifted in the X and/or Y directions so that a different exposure area C can be irradiated by the beam PB;

2. In step-and-scan (scan) mode, essentially the same scenario applies, except that a given exposure area C is not exposed in a single "flash". Instead, the mask table MT is movable in a given direction (the so-called "scan direction", e.g. the Y direction) with a speed v, so that the projection beam PB is caused to scan over a mask image; concurrently, the substrate table WTa or WTb is moved in the same or opposite direction at a speed V=Mv, in which M is the magnification of the lens PL (typically, M=¼ or ⅕). In this manner, a relatively large exposure area C can be exposed, without having to compromise on resolution.

An important factor influencing the imaging quality of a lithographic apparatus is the accuracy with which the mask image is focused on the substrate. In practice, since the scope for adjusting the position of the focal plane of the projection system PL is limited and the depth of focus of that system is small, it may be desirable or necessary for the exposure area of the wafer (substrate) to be positioned precisely in the focal plane of the projection system PL. To do this, it may of course be necessary to know both the position of the focal plane of the projection system PL and the position of the top surface of the wafer.

Wafers are polished to a very high degree of flatness but nevertheless deviation of the wafer surface from perfect flatness (referred to as "unflatness") of sufficient magnitude noticeably to affect focus accuracy can occur. Unflatness may be caused, for example, by variations in wafer thickness, distortion of the shape of the wafer or contaminants on the wafer holder. The presence of structures due to previous process steps also significantly affects the wafer height (flatness). Unless the context otherwise requires, references below to "the wafer surface" refer to the top surface of the wafer onto which will be projected the mask image.

Figure 2:
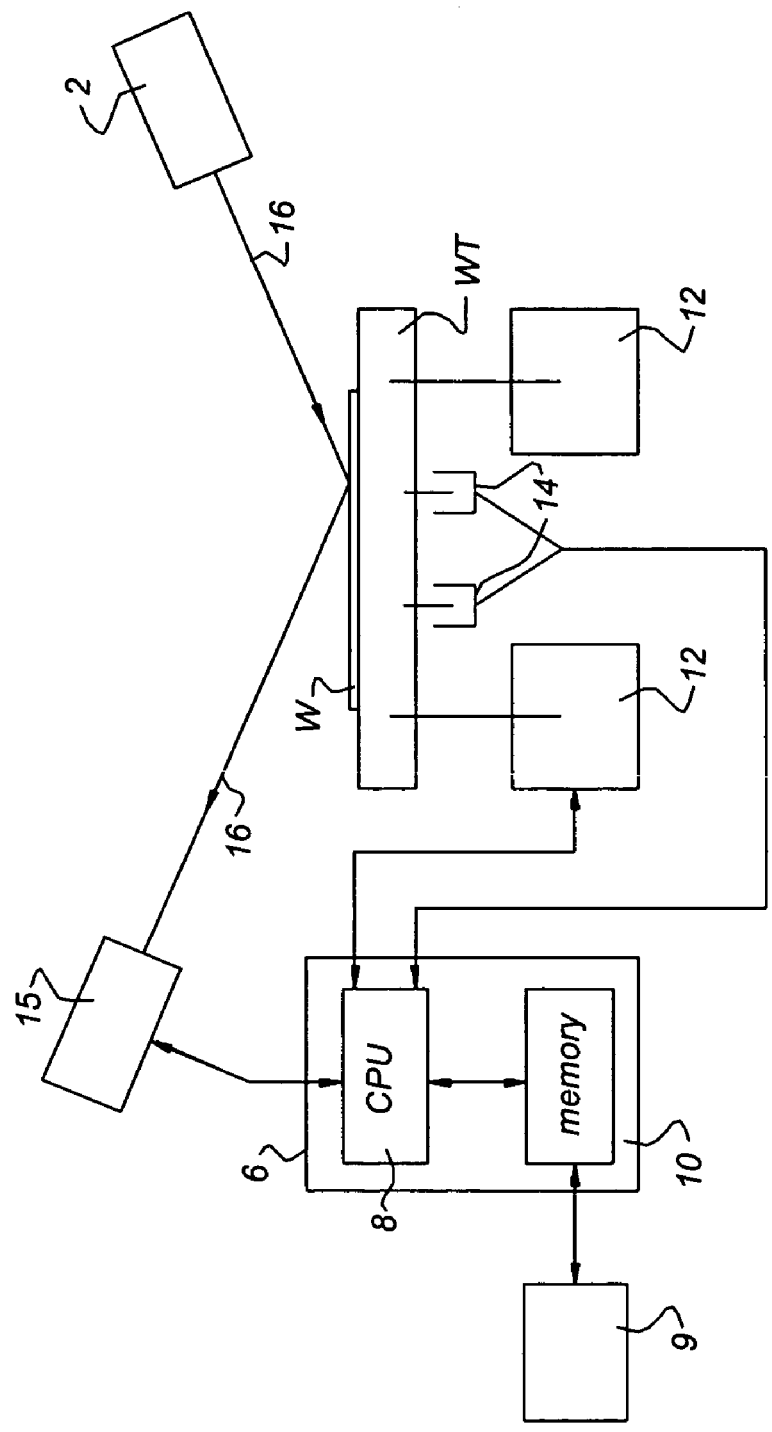
FIG. 2 shows a part of the measurement station region of the lithographic projection apparatus, including a level sensor.

In FIG. 2, a part of the measurement station region of the lithographic projection apparatus is shown. The substrate W is held on the substrate table WT. The substrate table WT is connected to actuators 12. These actuators 12 are connected to a control device 6 with a processor 8 and a memory 10. The processor 8 further receives information from position sensors 14 measuring the actual position of the wafer table WT or wafer table holder by electric (capacitive, inductive) or optical, e.g. interferometric (as shown in FIG. 1) means. The processor 8 also receives input from a level sensor LS which measures the height and/or tilt information from the target area on the wafer where the projection beam PB will hit the substrate surface. Preferably, the control device 6 is connected to a reporting system 9, which may comprise a PC or a printer or any other registration or display device.

The level sensor LS may be, for example, an optical sensor; alternatively, a pneumatic or capacitive sensor (for example) is conceivable. A presently preferred form of sensor is an optical sensor making use of Moire patterns formed between the image of a projection grating reflected by the wafer surface and a fixed detection grating as described in U.S. Pat. No. 5,191,200. The level sensor LS should preferably measure the vertical position of one or more very small areas (e.g. 15 nm) of the wafer surface. The LS shown in FIG. 2, comprises a light source 2 for producing a light beam 16, projection optics (not shown) for projecting the light beam 16 onto the wafer W, detection optics (not shown) and a detector 15. The detector generates a height dependent signal, which is fed to the processor 8. The processor is arranged to process the height information and to construct a measured height map. Such a height map may be stored by the processor 8 in the memory 10. As noted above, the term 'height map' is intended to include a plurality of substrate height measurements, each recorded with associated X and Y co-ordinates.

FIG. 2 relates to a multi stage lithographic apparatus. However, according to another embodiment of the invention, the level sensor LS may be present in a single stage lithographic projection apparatus.

The level sensing method may use one or more small areas and measure the average height of the small areas, referred to as sensing spots. A selection mechanism may be used to select the spots (which may be applied to derive height and/or tilt information from a measured target area) depending on the position of the sensing spots on the wafer area. For example, it may be desired that sensing spots outside the measured target area are not selected to derive height information.

If only those sensing spots falling fully within the target area were to be used, less then 100% of the target area would be measured. This would mean that a focus spot might fall within a non-measured area, and might therefore not be detected. A way to solve this problem is by using extra sensing spots which cross the border of the target area. In this way all relevant areas on the wafer may be sensed and may be available for focus spot detection algorithms.

Figure 3A:
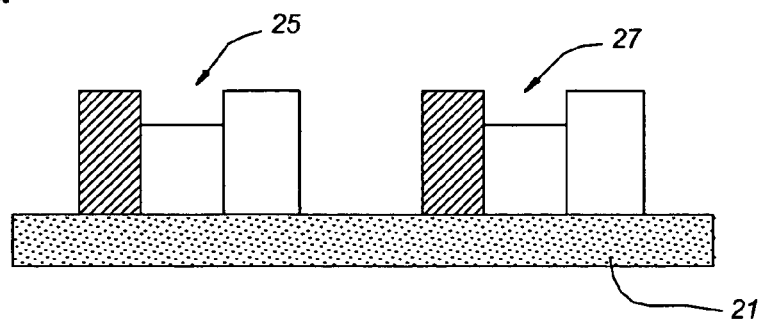
FIG. 3A shows a side view of a part of a flat substrate with already (partly) processed dies.
Figure 3B:
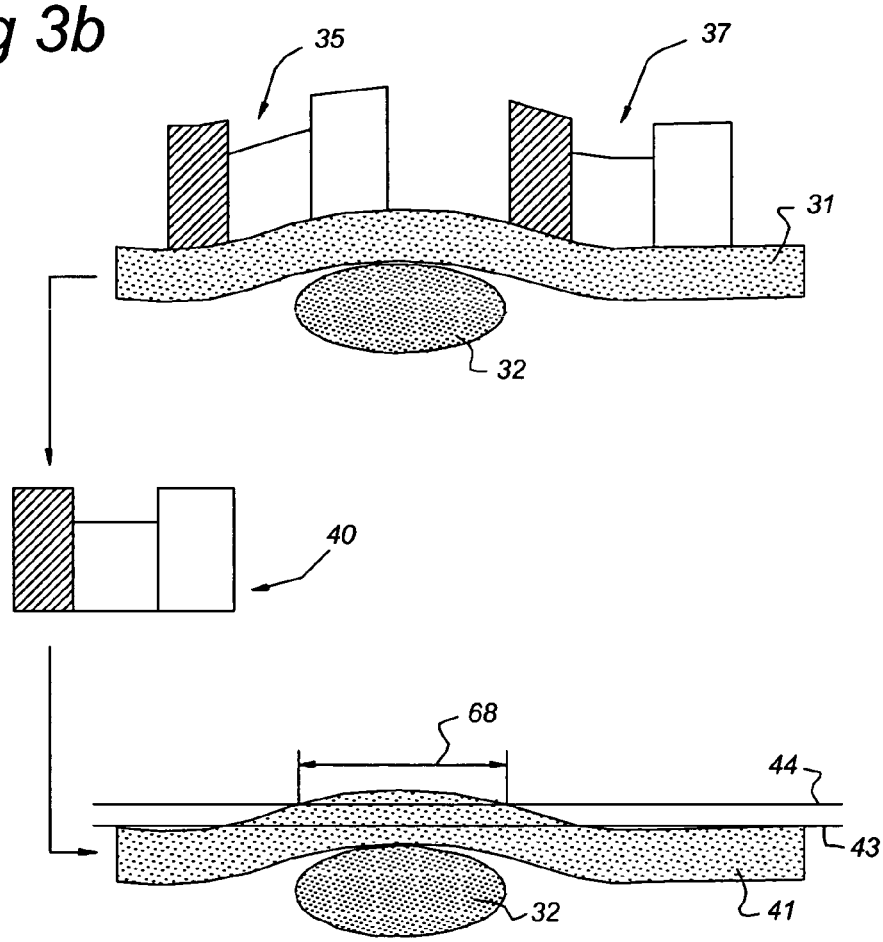
FIG. 3B shows a side view of the substrate having an unflatness due to a contamination particle, and shows an imaginary side view of the substrate after subtraction of an average die topology.

A principle of an embodiment of the present invention is now explained with the help of FIGS. 3A and 3B. FIG. 3A shows a side view of a substrate 21 with two structures, representing two dies (target areas) 25, 27. In FIG. 3A, the substrate 21 is flat, showing no signs of contamination underneath.

FIG. 3B however, shows a substrate 31 having an unflatness caused by a contamination particle 32. The contamination particle 32 is situated between a substrate holder, not shown, and the substrate 31. Due to the unflatness of the substrate 31, the surface of the wafer, i.e. the top surfaces of dies 35, 37 laying on top of the substrate 31, also shows an 'unflatness'. In an embodiment of the invention, the processor 8 is arranged to create a measured height map out of height information received from the level sensor LS. Because of the relatively large dimensions of the structures of the dies (i.e. topology), the 'unflatness' is hidden. This means that while the measured height map may contain information on the unflatness, it may be very difficult to accurately locate and register a contamination particle.

A lithographic projection apparatus according tone embodiment of the invention comprises a processor 8, arranged to calculate an average die topology 40, see FIG. 3B, and to subtract the average die topology 40 from the measured height map for dies on the substrate, thereby producing a raw height map of the substrate surface. FIG. 3B shows the situation after the subtraction. An imaginary substrate 41 is shown, without any die on top. Due to the contamination particle 32, the substrate 41 shows an unflatness. According to an embodiment, a smoothed height map 43 is subtracted from the raw height map. For all positions of the substrate, deviations (i.e. residuals) are calculated, resulting in a 'subtracted height map' of the substrate surface. These residuals are used to determine a standard deviation $\sigma$. Next, focus spots are defined as being areas on the substrate 41, in which the residual height is n times higher than $\sigma$, with n being an integer or any positive real number. In FIG. 3B, a threshold line 44 is shown which indicates a height that is $n*\sigma$ higher than the smoothed height map 43. Areas in which the subtracted height map exceeds the threshold line 44, are defined as focus spots 68. It is appreciated that other mathematical calculations are possible to define the threshold and the focus spots, using the 'subtracted height map' and/or other data. For example, an absolute threshold $Z_{max}$ may be used to detect focus spots.

Figure 4:
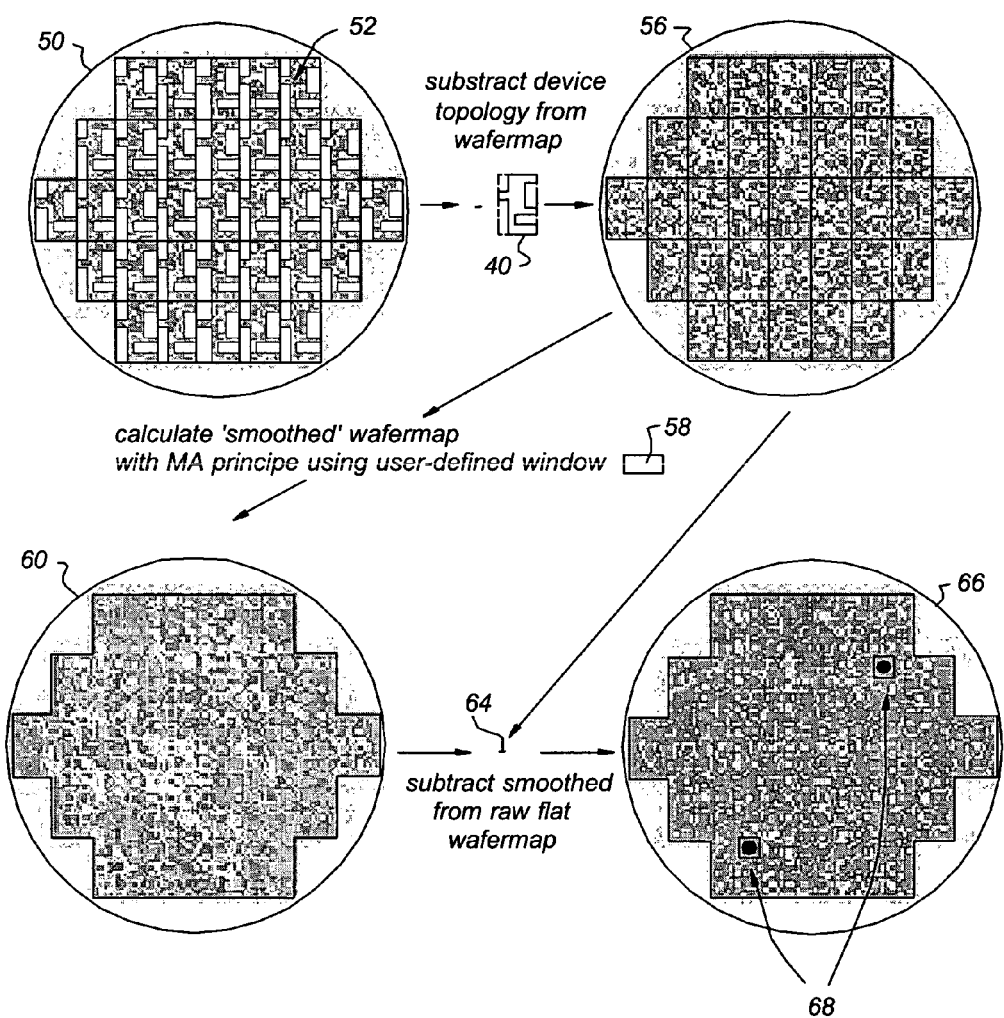
FIG. 4 shows a flow chart with four top views of different height maps during the processing of height map information.

In at least one embodiment, the processor 8 is arranged to process the measured height map. FIG. 4 shows a flow chart with four top views of the different height maps during the processing of the height map information. A measured height map 50 contains height information of a plurality of points on the substrate. The degree of detail of the height map may be dependent on the resolution of the level sensor, which is used to measure the heights of the particular points, as will be clear to a skilled person.

The measured height map 50 comprises height information from several dies 52. The processor 8 is arranged to calculate an average die topology, depicted in FIG. 4 by 40. The average die topology 40 is calculated by adding the height of a particular point $(x_k,y_k)$ within a die k, (where $(x_k,y_k)$ indicates a local co-ordinate within the die), to the height of the corresponding points $(x_k,y_k)$ in the other dies k, with k=1, 2, . . . N wherein N is equal to the number of dies on the substrate. This is done for all points within the dies 52. Then, for all the points $(x_k,y_k)$ within the dies 52, the result of the addition is divided by the number of dies, i.e. N. The result is an average die topology, as shown in FIG. 2B, and indicated in FIG. 4 by reference number 40.

Next, the average die topology 40 is subtracted from the measured height map 50, at each of the die locations. This results in a raw height map 56 of the substrate surface. Then, the raw height map 56 is smoothed, e.g. using a moving average principle with a smoothing window 58. According to an embodiment of the invention the processor 8 is arranged to smooth the raw height map by calculating an average height at a point x,y, i.e. AH(x,y), wherein the average height AH(x,y) is equal to the sum of all heights $H(x_i,y_i)$ in a window [(x−a, y+a), (x−a,y−a), (x+a,y+a), (x+a,y−a)] divided by the number of points $x_i,y_i$ in said window, where a is the size of said window. The smoothing window 58 is preferably relatively large as compared to the expected focus spots. Typical values of the size of a focus spot is 5*5 mm. So preferably, the window is larger than 10*10 mm, particularly 15*15 mm (i.e. a=7.5 mm). The result of the smoothing of the raw height map 56 is a smoothed height map 60, see FIG. 4.

Then, the smoothed height map 60 is subtracted from the raw height map for every x, y position of the substrate. This operation, indicated by the '31' sign 64 in FIG. 4, results in a map called the subtracted height map 66. From this subtracted height map 66 it is possible to locate local unflatnesses (i.e. hills) 68 very easily. If such unflatnesses exceed a predefined deviation threshold F, the areas in which these unflatnesses occur, are labelled as focus spots. In an embodiment of the invention, different deviation thresholds are used to classify, for example, critical and less critical focus spots. In a multi-stage apparatus for example, it is possible to reject a wafer when the wafer comprises (too many) critical focus spots, before the wafer is even processed at the exposure station. This increases yield of the apparatus.

In another embodiment, the apparatus comprises a reporting system, wherein the reporting system and the processor are arranged to report different classifications of focus spots. If relatively large focus spots occur, they may cause processing to immediately cease, while smaller focus spots only need to be reported, in for example an administration file.

In at least one embodiment, the processor 8 is arranged to filter out obvious errors such as measurement errors, local dirt on the substrate, or a focus spot itself. This is achieved by repeating all actions shown in FIG. 4 but with a so-called feedback height map (not shown) instead of with a measured height map 50. This feedback height map is fabricated by removing, from the measured height map 50, height information of dies that overlap with the determined focus spots.

Next, the feedback height map is used to calculate a corrected average die topology. The corrected average die topology is calculated in the same way as the average die topology 40, shown in FIG. 4, is calculated. Then, the corrected average die topology is subtracted from the feedback height map for dies on the substrate. This leaves a so-called corrected raw height map of the surface of the substrate. The next action is to smooth the corrected raw height map, e.g. using a moving average principle, as was done with the raw height map, mentioned above. The result is a corrected smoothed height map. From the corrected raw height map the corrected smoothed height map from is subtracted, thereby producing a corrected subtracted height map. Then, a deviation threshold F is determined. Next, the focus spots are determined as being areas in which a residual on the corrected subtracted height map is greater than the at least one deviation threshold F.

The above actions may be repeated until a certain accuracy level is reached. By removing the height information of the dies that are on top of a focus spot, and repeating the actions mentioned above, the obvious errors are filtered out. By filtering out the obvious errors, a higher degree of accuracy can be reached.

Preferably, before the average die topology is subtracted from the measured height map, a second or third order polynomial fit is subtracted from the measured height map, in order to remove a global shape of said substrate. The global shape of the substrate may blind local focus spot information in the height maps, so subtracting a second or third order polynomial may increase the accuracy. Of course fourth, fifth or even higher order polynomials may be used. The polynomial fit may also be subtracted from the measured height map after the average die topology has been subtracted.

In a method according to an embodiment of the invention, the subtracted height maps of successively provided substrates are compared. Such comparison may be used to detect correlations in the locations of any unflatnesses that may be indicative of contamination or systematic faults of said second object table. In this way, so-called 'chuck spots' are located, and it may be decided to clean the substrate holder. In order to detect chuck spots, the location of focus spots on successive substrates (on the same chuck) is compared. In this comparison also the size of the focus spots may be taken into account. Two focus spots will then be regarded as being on the same position if they overlap, or nearly overlap. When the number of focus spots on the same position on successive wafers exceeds a certain threshold level, it will then be considered a chuck spot.

A lithographic projection apparatus according to one embodiment of the invention comprises a radiation system for supplying a projection beam of radiation; a first object table provided with a mask holder for holding a mask; a second object table provided with a substrate holder for holding a substrate; a projection system for imaging an irradiated portion of the mask onto a target portion of the substrate; a level sensor arranged to measure the height of a plurality of points on the surface of a substrate provided with at least one die, and a processor arranged to create a measured height map using input from said level sensor, characterized in that said processor is also arranged to calculate an average die topology using the measured height map, and to subtract the average die topology from said measured height map for dies on the substrate, to produce a raw height map of the surface of the substrate in order to detect any focus spots on the surface of the substrate using the raw height map.

In another apparatus, the processor is arranged to smooth said raw height map using a moving average principle, thereby producing a smoothed height map; subtract the smoothed height map from the raw height map, thereby producing a subtracted height map; determine at least one deviation threshold F; and determine focus spots as being areas in which a residual on the subtracted height map is greater than the at least one deviation threshold F.

In another apparatus, the at least one deviation threshold F is defined as n·σ, where n is a predetermined value and σ is a standard deviation of all residuals for every position x, y on the subtracted height map.

In another apparatus, the processor is arranged to remove height information from the subtracted height map of dies that overlap with the determined focus spots, thereby producing a feedback height map; calculate a corrected average die topology using the feedback height map, subtract the corrected average die topology from the feedback height map for dies on the substrate, to produce a corrected raw height map of said surface of the substrate; smooth the corrected raw height map using a moving average principle, thereby producing a corrected smoothed height map; subtract the corrected smoothed height map from the corrected raw height map, thereby producing a corrected subtracted height map; determine the at least one deviation threshold F; determine the focus spots as being areas in which a residual on the corrected subtracted height map is greater than the at least one deviation threshold F, and repeat the above actions until a certain accuracy level is reached.

Another apparatus comprises a reporting system arranged to report focus spots, for example to a user. In another apparatus, the reporting system and the processor are arranged to report different classifications of focus spots.

In another apparatus, the processor is arranged to subtract a second or third order polynomial fit from said measured height map, in order to remove a global shape of said substrate.

In another apparatus, the processor is arranged to smooth the raw height map by calculating an average height in a point x,y, i.e. AH(x,y), wherein the average height AH(x,y) is equal to the sum of all heights H(xi,yi) in a window [(x−a, y+a), (x−a,y−a), (x+a,y+a), (x+a,y−a)] divided by the number of points xi,yi in the window, where a is the size of the window.

In another apparatus, the second object table is movable between an exposure station, at which said projection system can image said mask portion onto said substrate, and a measurement station, and the apparatus comprises a positioning system for moving the second object table between the exposure station and the measurement station, and a control unit constructed and arranged to control the position of the second object table, during exposure of the target portion, in accordance with the measured height map.

A method of manufacturing devices according to one embodiment of the invention uses a lithographic projection apparatus comprising a radiation system for supplying a projection beam of radiation; a first object table provided with a mask holder for holding a mask; a second object table provided with a substrate holder for holding a substrate; a projection system for imaging irradiated portions of the mask onto target portions of the substrate; a level sensor arranged to measure the height of a plurality of points on the surface of a substrate provided with at least one die, and a processor arranged to create a measured height map using input from the level sensor. The method comprises providing a mask bearing a pattern to the first object table; providing a substrate having a radiation-sensitive layer to the second object table; imaging the irradiated portions of the mask onto the target portions of the substrate; and generating, for the substrate, a measured height map indicating the height of a plurality of points on the substrate surface, characterized by calculating an average die topology using the measured height map; subtracting the average die topology from the measured height map for dies on the substrate, to produce a raw height map of the surface of the substrate in order to detect any focus spots on the surface of the substrate using the raw height map.

Another method includes smoothing the raw height map using a moving average principle, thereby producing a smoothed height map; subtracting the smoothed height map from the raw height map, thereby producing a subtracted height map; determining at least one deviation threshold F; and determining focus spots as being areas in which a residual on said subtracted height map is greater than the at least one deviation threshold F.

In another method, the providing of a substrate and the imaging are repeated to expose a plurality of substrates, the method further comprising comparing the subtracted height maps of successively provided substrates to detect correlations in the locations of any focus spots that may be indicative of contamination or systematic faults of the second object table.

Whilst specific embodiments of the invention have been described above, it will be appreciated that the invention may be practiced otherwise than as described. For example, instead of using a rectangular smoothing window, other shapes like circular or oval windows, may be possible. Embodiments of the invention also include computer programs containing one or more sets (e.g. sequences) of machine-executable instructions describing a method as disclosed herein, and data storage media (e.g. semiconductor memory such as ROM or RAM, magnetic or optical disk) having such sets of instructions stored therein. The description is not intended to limit the invention.

What is claimed is:

1. A lithographic apparatus comprising:
   a level sensor arranged to determine a height of each of a plurality of points on a surface of a substrate, the substrate being provided with at least one die; and
   a processor configured to create a first height map based on the determined heights, to calculate a topology based on information of said first height map that corresponds to said at least one die, and to produce a second height map of said surface based on a difference between said topology and said first height map.

2. The lithographic apparatus according to claim 1, wherein the second height map is based on differences between said topology and portions of said first height map that correspond to said at least one die.

3. The lithographic apparatus according to claim 1, wherein said processor is configured to detect, based on said second height map, focus spots on said surface.

4. The lithographic apparatus according to claim 3, wherein said apparatus comprises a reporting system arranged to report at least a detection of focus spots.

5. The lithographic apparatus according to claim 4, wherein said reporting system and said processor are arranged to report detection of different classifications of focus spots.

6. The lithographic apparatus according to claim 1, wherein said topology is an average die topology.

7. The lithographic apparatus according to claim 1, said apparatus further comprising:
   a radiation system configured to supply a beam of radiation;
   a projection system configured to image an irradiated portion of a mask onto a target portion of the substrate;
   a mask holder configured to hold the mask; and
   a substrate holder configured to hold the substrate.

8. The lithographic apparatus according to claim 7, said apparatus further comprising:
   a first object table configured to move the mask relative to the projection system; and
   a second object table configured to move the substrate relative to the projection system.

9. The lithographic apparatus according to claim 1, wherein said processor is arranged to:
   produce a smoothed height map based on said second height map;
   produce a subtracted height map based on a difference between said smoothed height map and said second height map; and
   determine focus spots as being areas in which a residual on said subtracted height map is greater than a threshold.

10. The lithographic apparatus according to claim 9, wherein said processor is arranged to produce a smoothed height map using a moving average principle.

11. The lithographic apparatus according to claim 9, wherein said processor is arranged to determine the threshold based on the subtracted height map.

12. The lithographic apparatus according to claim 9, wherein the threshold is based on a standard deviation of substantially all of the residuals in said subtracted height map.

13. The lithographic apparatus according to claim 12, wherein each residual corresponds to an x, y position.

14. The lithographic apparatus according to claim 9, wherein said processor is arranged to determine a plurality of thresholds based on the subtracted height map.

15. The lithographic apparatus according to claim 9, wherein said processor is arranged to:
   produce a feedback height map by removing, from the first height map, determined heights corresponding to dies that overlap with determined focus spots; and
   generate a corrected subtracted height map based on the feedback height map, wherein said generating includes:
      calculating a corrected avenge die topology using said feedback height map;
      subtracting said corrected average die topology from said feedback height map for dies on said substrate, to produce a corrected second height map of said surface of said substrate;
      smoothing said corrected second height map to produce a corrected smoothed height map;
      subtracting said corrected smoothed height map from said corrected second height map to produce a corrected subtracted height map; and
      determining focus spots as being areas in which a residual on the corrected subtracted height map is greater than a second threshold.

16. The lithographic apparatus according to claim 15, wherein said processor is arranged to determine the second threshold based on the corrected subtracted height map.

17. The lithographic apparatus according to claim 15, wherein said processor is arranged to produce feedback height maps and to generate corresponding corrected subtracted height maps until a certain accuracy level is reached.

18. The lithographic apparatus according to claim 1, wherein said processor is arranged to subtract from said first height map a data set expressing a global shape of said substrate.

19. The lithographic apparatus according to claim 18, wherein said data set includes a polynomial fit.

20. The lithographic apparatus according to claim 9, wherein said processor is arranged to smooth said second height map by applying a two-dimensional averaging window.

21. The lithographic apparatus according to claim 9, wherein said processor is arranged to smooth said raw height map by calculating an average height AH(x,y) at a point x,y, wherein said average height AH(x,y) is equal to the sum of all heights $H(x_i, y_i)$ in a window [(x−a,y+a), (x−a,y−a), (x+a,y+a), (x+a,y−a)] divided by the number of points $x_i, y_i$ in said window, where a is the size of said window.

22. The lithographic apparatus according to claim 1, wherein said second object table is movable between an exposure station and a measurement station, and wherein said apparatus comprises:

a positioning system configured to move said second object table between said exposure station and said measurement station; and a control unit constructed and arranged to control a position of said second object table, during exposure of said target portion, in accordance with said measured height map, and wherein said projection system is configured to image said mask portion onto said substrate when the second object table is at the exposure station.

23. A method of manufacturing devices, said method comprising:

determining a height of each of a plurality of points on the surface of a substrate, the substrate being provided with at least one die;

generating a first height map based on the determined heights;

calculating a topology based on information of the first height map that corresponds to said at least one die; and producing a second height map of said surface, said producing including subtracting said topology from at least a part of said first height map.

24. The method of manufacturing devices according to claim 23, wherein the second height map is based on differences between said topology and portions of said first height map that correspond to said at least one die.

25. The method of manufacturing devices according to claim 23, said method comprising detecting, based on said second height map, focus spots on said surface.

26. The method of manufacturing devices according to claim 25, said method comprising imaging irradiated portions of a mask onto target portions of the substrate having a radiation-sensitive layer.

27. The method of manufacturing devices according to claim 26, wherein said imaging is repeated to expose a plurality of substrates, and wherein said method comprises comparing subtracted height maps of said plurality of substrates to detect correlations in the locations of focus spots.

28. The method of manufacturing devices according to claim 25, said method further comprising reporting at least a detection of focus spots.

29. The method of manufacturing devices according to claim 23, wherein said topology is an average die topology.

30. The method of manufacturing devices according to claim 23, wherein said method comprises:

producing a smoothed height map based on said second height map;

producing a subtracted height map based on a difference between said smoothed height map and said second height map; and determining focus spots as being areas in which a residual on said subtracted height map is greater than a threshold.

31. The method of manufacturing devices according to claim 30, wherein said producing a smoothed height map includes using a moving average principle.

32. The method of manufacturing devices according to claim 30, wherein said threshold is based on the subtracted height map.

33. The method of manufacturing devices according to claim 30, wherein the threshold is based on a standard deviation of substantially all of the residuals in said subtracted height map.

34. The method of manufacturing devices according to claim 30, wherein said method includes:

producing a feedback height map by removing, from the first height map, determined heights corresponding to dies that overlap with determined focus spots; and generating a corrected subtracted height map based on the feedback height map, said generating including:

calculating a corrected average die topology using said feedback height map;

subtracting said corrected average die topology from said feedback height map for dies on said substrate, to produce a corrected second height map of said surface of said substrate;

smoothing said corrected second height map to produce a corrected smoothed height map;

subtracting said corrected smoothed height map from said corrected second height map to produce a corrected subtracted height map; and determining focus spots as being areas in which a residual on the corrected subtracted height map is greater than a second threshold.

35. The method of manufacturing devices according to claim 23, wherein said processor is arranged to subtract from said first height map a data set expressing a global shape of said substrate.

36. The method of manufacturing devices according to claim 23, wherein said smoothing said second height map includes applying a two-dimensional averaging window.

* * * * *

UNITED STATES PATENT AND TRADEMARK OFFICE
CERTIFICATE OF CORRECTION

PATENT NO. : 7,012,672 B2
APPLICATION NO. : 10/796309
DATED : March 14, 2006
INVENTOR(S) : Tasja Van Rhee et al.

It is certified that error appears in the above-identified patent and that said Letters Patent is hereby corrected as shown below:

On the title page, item (30) Foreign Application Priority Data:
 replace "03075698" with --03075698.5--

Column 9, line 18
 replace "tone" with --to one--

Column 9, line 64
 replace "2B" with --3B--

Column 14, line 23
 replace "avenge" with --average--

UNITED STATES PATENT AND TRADEMARK OFFICE
CERTIFICATE OF CORRECTION

PATENT NO. : 7,012,672 B2
APPLICATION NO. : 10/796309
DATED : March 14, 2006
INVENTOR(S) : Tasja Van Rhee et al.

It is certified that error appears in the above-identified patent and that said Letters Patent is hereby corrected as shown below:

Please replace Figure 2 that is shown in the Letters Patent for Figure 2 shown below:

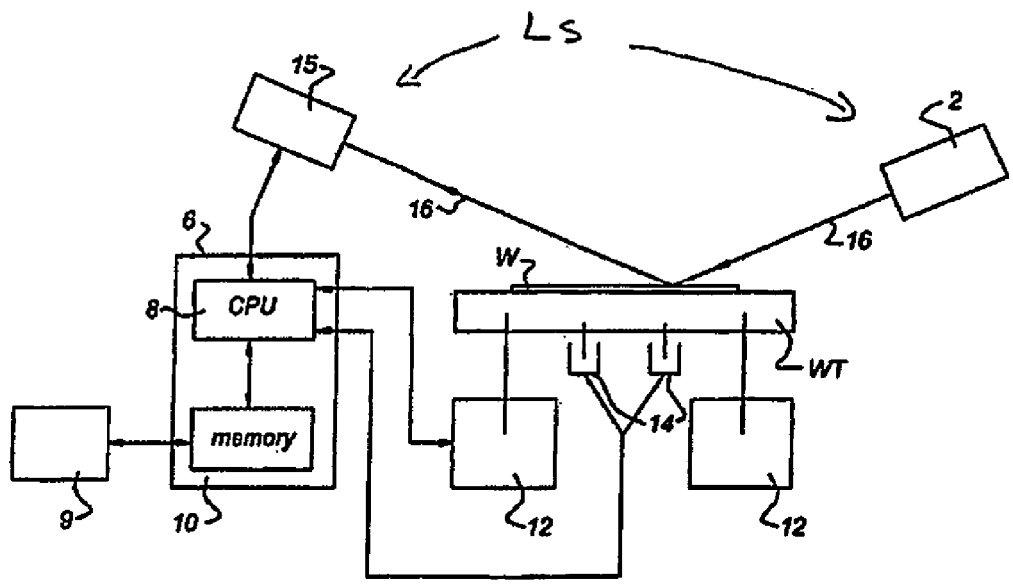

Signed and Sealed this

First Day of May, 2007

JON W. DUDAS
*Director of the United States Patent and Trademark Office*